United States Patent
Furuse

[11] Patent Number: 6,043,111
[45] Date of Patent: Mar. 28, 2000

[54] SMALL SIZE SEMICONDUCTOR PACKAGE

[75] Inventor: Satoshi Furuse, Yamagata, Japan

[73] Assignee: NEC Corporation, Tokyo, Japan

[21] Appl. No.: 08/903,340

[22] Filed: Jul. 30, 1997

[30] Foreign Application Priority Data

Jul. 30, 1996 [JP] Japan ................................. 8-200717

[51] Int. Cl.[7] .................................................. H01L 21/44
[52] U.S. Cl. ....................... 438/123; 438/111; 438/112; 257/670; 257/674; 257/676
[58] Field of Search ................... 438/111, 112, 438/123; 257/670, 674, 676

[56] References Cited

U.S. PATENT DOCUMENTS

| 4,012,765 | 3/1977 | Lehner et al. ................ 257/670 |
| 4,631,805 | 12/1986 | Olsen et al. ................ 438/123 |
| 5,334,553 | 8/1994 | Popat et al. ................ 438/123 |
| 5,512,781 | 4/1996 | Inoue ........................... 257/676 |
| 5,530,284 | 6/1996 | Bailey ........................... 257/676 |
| 5,705,431 | 1/1998 | Mori ............................. 438/123 |
| 5,766,985 | 6/1998 | Mangiagli et al. ............ 438/123 |
| 5,792,676 | 8/1998 | Masumoto et al. .......... 438/111 |
| 5,859,387 | 1/1999 | Gagnon ....................... 257/676 |

FOREIGN PATENT DOCUMENTS 2-17664  1/1990  Japan .
4-31326  2/1992  Japan .

*Primary Examiner*—Kevin M. Picardat

[57] ABSTRACT

A semiconductor package for a bipolar transistor comprises a lead frame including a plurality of inner leads arranged in a resin mold package. The inner leads include a collector lead mounting thereon a transistor element and occupying substantially the upper half area of the package, a base lead located at a central part of the lower half area, and an emitter lead extending between the spaces between the collector lead and base lead for improvement of transistor characteristics in a high frequency range. The gap (0.2 mm) between the leads is smaller than the thickness (0.26 mm) of the lead frame for reduction of package size. After punching press of the metallic plate, the metallic pattern plate is subjected to press-bending and/or non-press bending technique for reducing the gap between the lead portions of the lead frame.

11 Claims, 7 Drawing Sheets

FIG. I
PRIOR ART
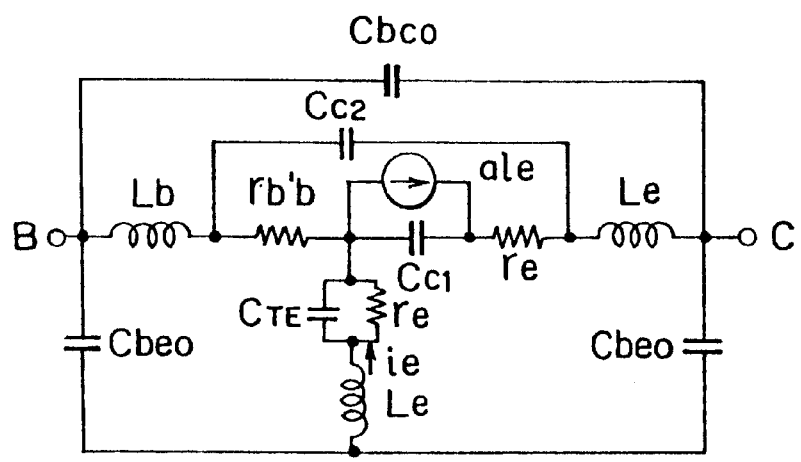
FIG. 2
PRIOR ART
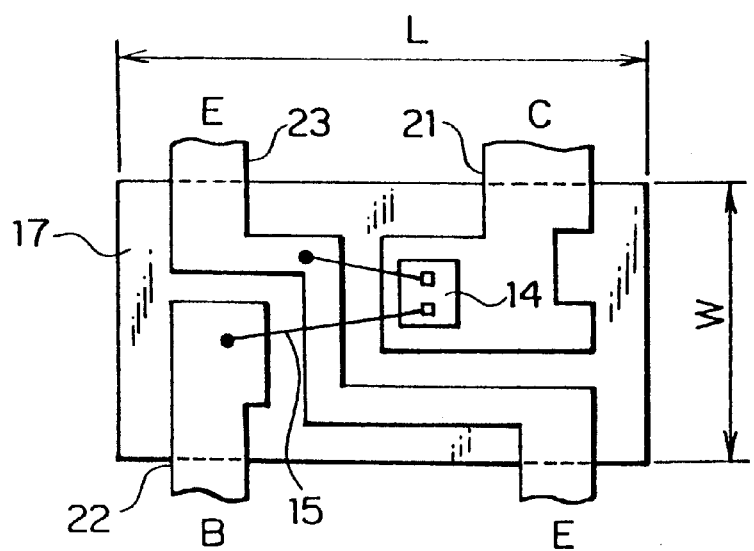

SMALL SIZE SEMICONDUCTOR PACKAGE

BACKGROUND OF THE INVENTION (a). Field of the Invention

The present invention relates to a small size semiconductor package and, more particularly, to a small size semiconductor package of a resin mold type used for a high frequency semiconductor device.

(b). Description of the Related Art

A GaAs FET is generally used for a high frequency electronic equipment such as a BS converter, a portable telephone or a radar system. A ceramic package is generally used for the GaAs FET, in order to reduce a power loss due to a parasitic capacitance or parasitic inductance especially in the high frequency range and to obtain desired characteristics. However, the ceramic package is extremely expensive to raise the total costs for the GaAs FET.

To reduce the manufacturing costs for a high frequency semiconductor device, a resin mold package is recently proposed instead of the ceramic package, for example, in JP-A-2(1990)-17664.

In the conventional semiconductor package for a high frequency bipolar transistor, a configuration has been generally employed in which an emitter lead is disposed between the collector lead and the base lead to thereby improve the transistor characteristics in the high frequency range.

FIG. 1 shows an equivalent circuit diagram for a high frequency bipolar transistor operating in the microwave range and received in a package, wherein parasitic capacitances $C_{bco}$ and $C_{c2}$ exist between collector electrode (C) and base electrode (B). By arranging the emitter lead between the collector lead and base lead, these parasitic capacitances $C_{bco}$ and $C_{c2}$ can be canceled to improve the transistor characteristics in the high frequency range.

FIG. 2 shows an example of a schematic top plan view of the semiconductor package of FIG. 1, which satisfies a SC-56 mini-mold transistor package design defined in Electric Industries Association of Japan (EIAJ) (hereinafter called SC-56 package). The SC-56 package comprises a collector lead 21 roughly occupying the central area and upper-right area of the package, a semiconductor element 14 mounted on the central area of the collector lead 21, a base lead 22 occupying the lower-left area, an emitter lead 23 occupying the upper-left area and the lower-right area and extending through the space between the collector lead 21 and base lead 22, and a plurality of bonding wires 15 for electrically connecting the pads of the semiconductor element 14 to the base lead 22 and emitter lead 23.

The SC-56 package is of a small external size as low as 2.9×1.5 mm, and exhibits excellent characteristics in the high frequency range. However, it has only a small heat capacity for the collector electrode, and accordingly, the application thereof is limited only to a transistor element of a small electric power, i.e., limited to a signal circuit.

FIG. 3A shows a schematic top plan view of another conventional package defined as SOT-89 package in EIAJ. The SOT-89 package has at the central area thereof a collector lead 21 having a large heat capacity and thus a function of heat dissipation, a transistor element 14 mounted on the central area of the emitter lead 21, a base lead 22 at the left area, and an emitter lead 23 at the right area, all of which are molded with a resin mold package. The SOT-89 package is of a large size as high as 4.5×2.5 mm and the leads used therein have a thickness of 0.4 mm. In this configuration, the emitter lead 23 cannot be disposed between the base lead 22 and collector lead 21 in order to improve the transistor characteristics in the high frequency range.

It may be considered to modify the SOT-89 package by disposing the emitter lead 23 between the base lead 22 and collector lead 21 to improve the transistor characteristics in the high frequency range. FIG. 3B shows the inferred arrangement modified from the SOT-89 package of FIG. 3A, wherein a gap of 0.4 mm or more is provided between each two of the inner leads due to the practical limit of the current etching or punching press technique, taking account of the 0.4-mm-thick leads which generally requires a gap of 0.4 mm or more between the leads. As understood from FIG. 3B, the emitter lead 23 disposed between the base lead 22 and collector lead 21 reduces the collector lead area to the extent that is not practical for mounting the transistor element 14 for heat dissipation.

Patent Publication JP-A-4(1992)-31326 proposes a technique for improving the lead density by reducing the gap between the leads down to below the thickness of the leads. The technique first uses a general etching or pressing technique for a lead frame having an extension portion formed in a tie bar of the lead frame, then uses lateral pressing at the extension portion to reduce the width of the tie bar to obtain a sufficient gap between the leads. This process, however, requires a special work process for the lead frame to thereby complicate the fabrication process for the package. In addition, it is difficult to reduce the width of the leads with a high accuracy because the side surface of the lead is not always vertical to the top surface thereof.

SUMMARY OF THE INVENTION

It is therefore an object of the present invention to provide an improved semiconductor package which has a size equivalent to the size of the conventional SOT-89 package defined in EIAJ and yet has improved characteristics in a high frequency range.

The present invention provides a semiconductor package comprising a semiconductor element having a plurality of pads thereon, a plurality of leads connected to the pads with bonding wires, the plurality of leads including a first lead mounting thereon the semiconductor element, and a resin mold package substantially of a rectangular prism for molding the semiconductor element and the leads, wherein at least one of the leads is bent to provide a gap between one of the leads and an adjacent one of the leads which is smaller than about 80% of a thickness of the leads.

In accordance with the semiconductor package according to the present invention, the small gap between the leads reduces the package size or provides an enough space for the leads in the semiconductor package, whereas the small gap formed by bending after a pressing operation does not retard the pressing operation.

The above and other objects, features and advantages of the present invention will be more apparent from the following description, referring to the accompanying drawings.

BRIEF DESCRIPTION OF THE DRAWINGS

FIG. 1 is an equivalent circuit diagram of a conventional transistor package;

FIG. 2 is a schematic top plan view of the internal arrangement of a SC-56 package defined in EIAJ;

PREFERRED EMBODIMENTS OF THE INVENTION

Figure 3A:
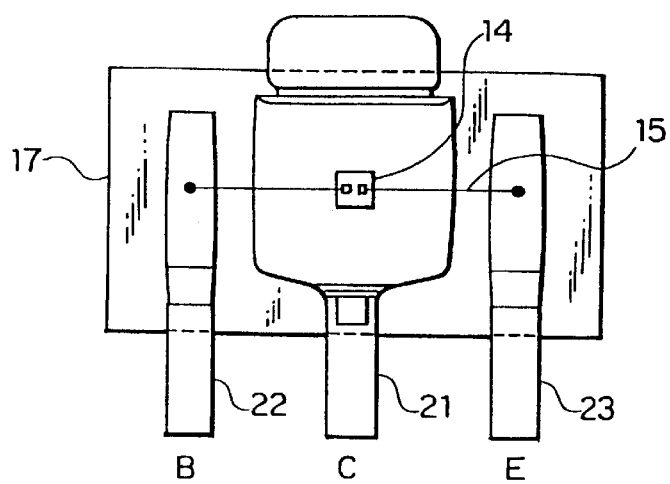
FIG. 3A is a schematic top plan view of the internal arrangement of a SOT-89 package defined in EIAJ.
Figure 3B:
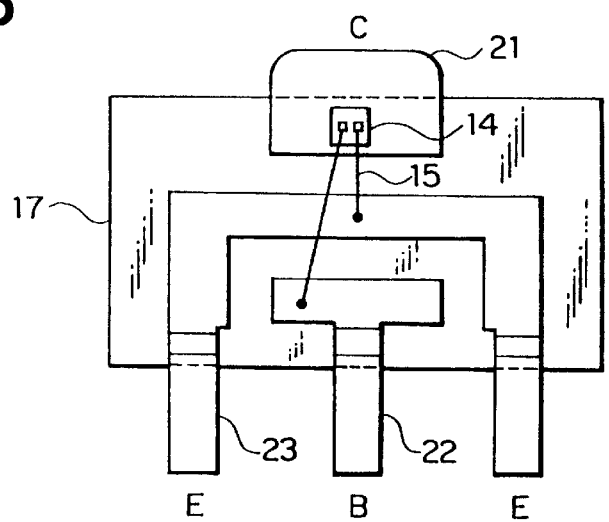
FIG. 3B is a schematic top plan view of the internal arrangement of an inferred transistor package modified from the SOT-89 package.

Now, the present invention is more specifically described with reference to accompanying drawings, wherein similar constituent elements are designated by the same or similar reference numerals throughout the drawings.

Figure 4:
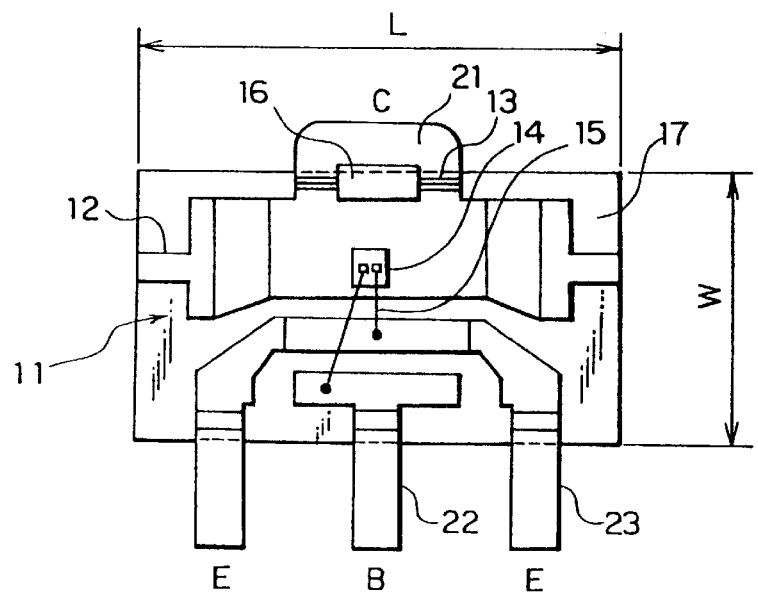
FIG. 4 is a schematic top plan view of the internal arrangement of a semiconductor package according to a first embodiment of the present invention.

Referring to FIG. 4, a semiconductor package according to a first embodiment of the present invention has improved characteristics in the high frequency range and yet has a size equivalent to the size of the conventional SOT-89 package having a 4.5-mm-long (L) and 2.5-mm-wide (w) surface. The semiconductor package comprises a bipolar transistor element 14, bonding wires 15 and a lead frame generally designated at numeral 11, all of which are molded in a mold resin 17 except for the outer lead portions of the lead frame 11.

The lead frame 11 includes a pair of suspension leads 12 disposed at the both sides of an upper half of the mold resin 17, a collector lead 21 including an inner lead portion supported at both sides thereof by the pair of suspension leads 12 and occupying substantially the upper half of the mold resin 17 and an outer lead portion at the upper-central edge of the mold resin 17, a base lead 22 including an inner lead portion disposed within the lower-center of the mold resin 17 and an outer lead portion at the lower-central edge of the mold resin 17, and an emitter lead 23 including an inner lead portion extending through the space between the collector lead 21 and base lead 22 and both the side parts of the lower half area and a pair of outer lead portions located at the lower-left edge and lower-right edge of the mold resin 17. The transistor element 14 is mounted on the central area of the inner lead portion of the collector lead 21 by a die bonding technique. The pads of the transistor element 14 are connected to the inner lead portions of the base lead 22 and emitter lead 23 with bonding wires 15.

The lead frame 11 used in the semiconductor package of the present embodiment has a thickness of 0.25 mm, for example, which is significantly lower than the thickness 0.4 mm of the conventional lead frame for the SOT-89 package, to achieve both a compact size of the package and improved characteristics in the high frequency range.

The pair of suspension leads 22 compensate the lower strength of the lead frame due to the small thickness to assure a stable fixing of the semiconductor element 14 within the resin mold 17. The width of the suspension leads 12 is designed as small as possible for relaxing and interrupting an external stress such as a thermal stress entering into the mold resin 17 while assuring an enough contact surface for contacting the leads with the mold resin 17. The collector lead 21 has an anchor hole 16 and notches 13 between the inner lead portion and outer lead portion thereof.

Figure 5:
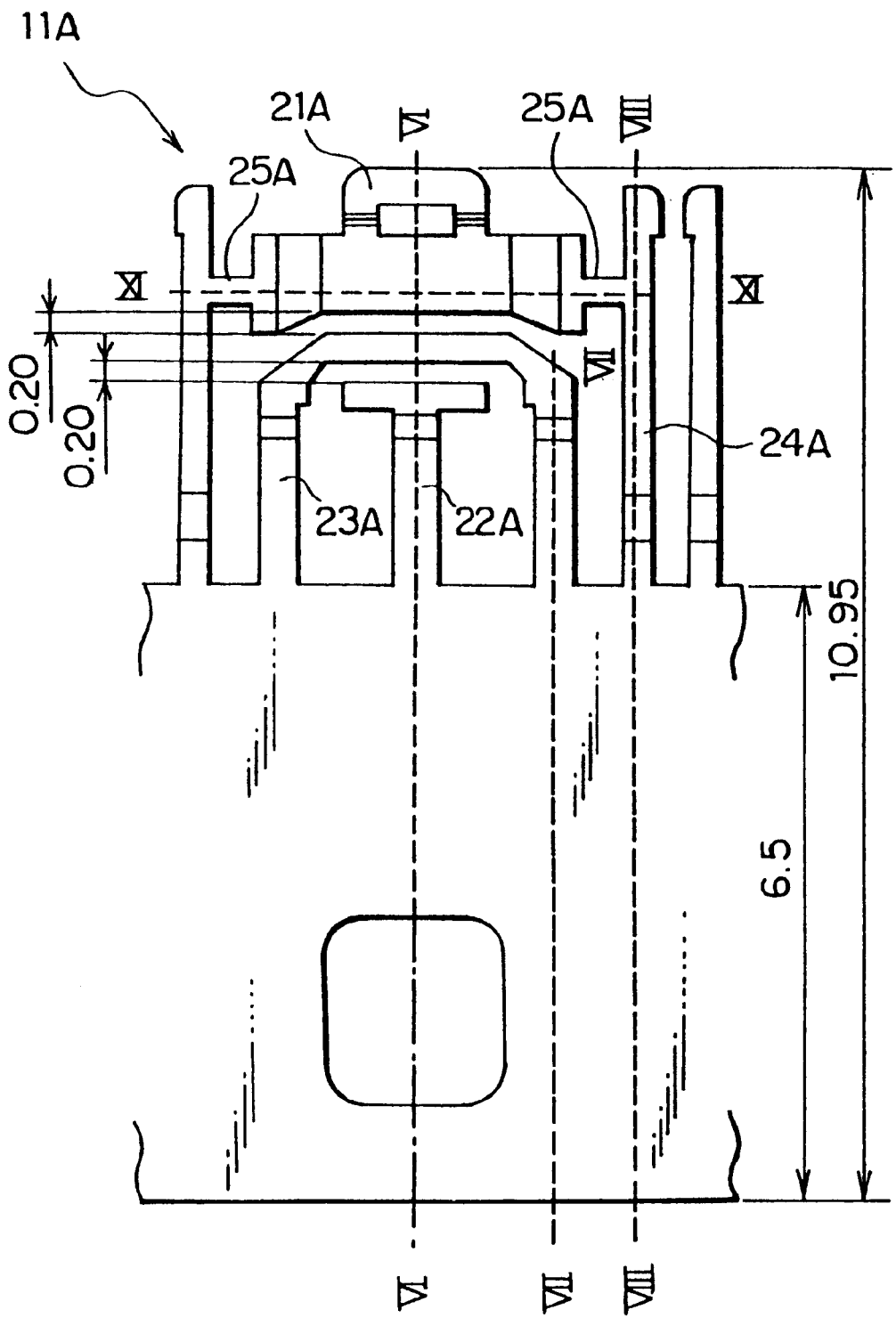
FIG. 5 is a top plan view of a lead frame incorporated in the semiconductor package of FIG. 4.
Figures 6, 7, 8, 9:
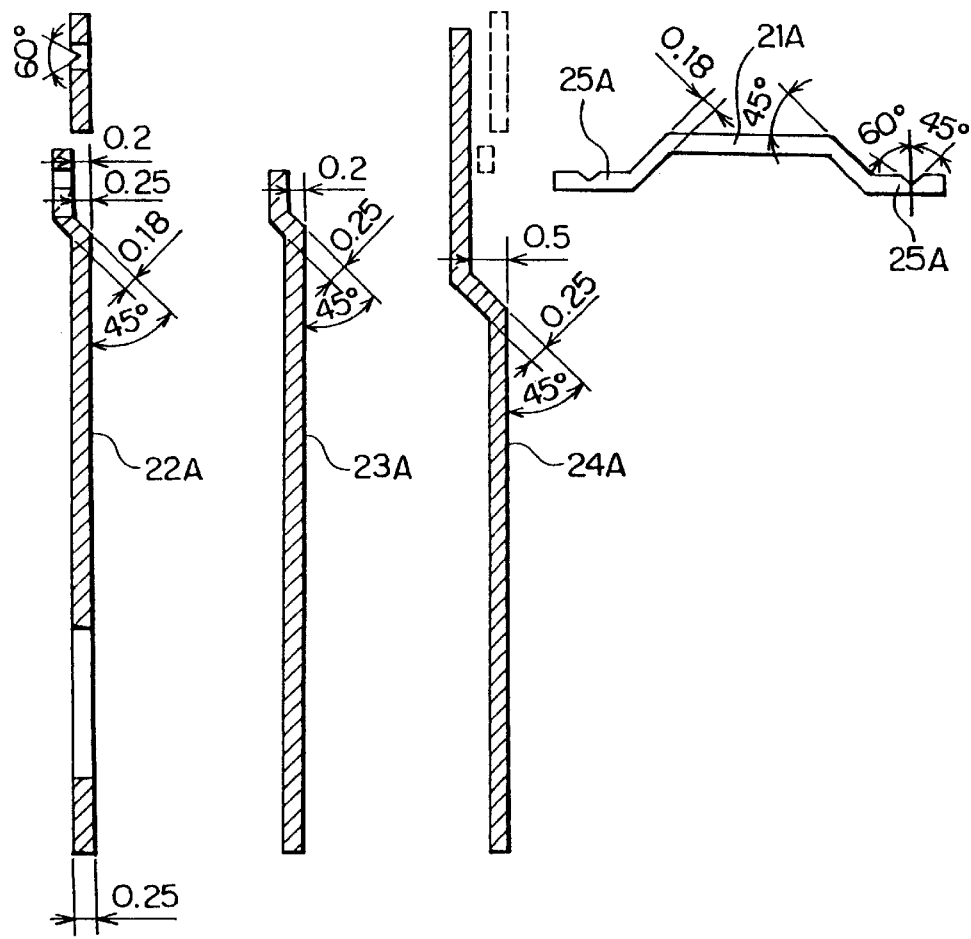
FIGS. 6 to 9 are sectional views taken along lines VI—VI, VII—VII, VIII—VIII and IX—IX, respectively, in FIG. 5.

FIG. 5 shows the lead frame 11A used in the semiconductor package of FIG. 4 at a step before installation therein. FIGS. 6 to 9 show sectional views taken along lines VI—VI, VII—VII, VIII—VIII and IX—IX, respectively, in FIG. 5 wherein detailed dimensions are exemplarily shown in the figures for the sake of understanding. The lead frame 11A has an original thickness of 0.25 mm and yet achieves a small gap as low as 0.2 mm between some leads. Specifically, the gaps between the emitter lead 23A and base lead 22A and between the emitter lead 23A and collector lead 21A are 0.20 mm, as viewed in the direction perpendicular to the original lead frame surface, to achieve a higher lead density. The bends shown in FIGS. 6 and 9 are obtained by press-bending to make the lead thickness 0.18 mm at the bent portion, whereas the bends shown FIGS. 7 and 8 are obtained by non-press bending to maintain the original thickness of 0.25 mm. The bent portions are at an angle of 45 degrees from the non-bent portions, as illustrated in the drawings.

Figure 10:
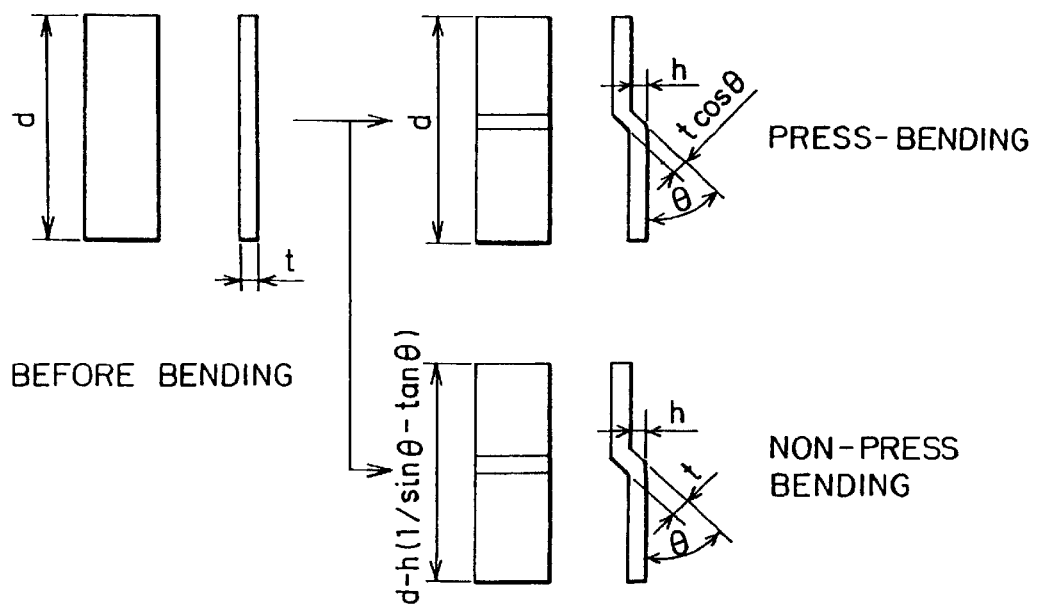
FIG. 10 is an explanatory set of views for showing the effect of the bending techniques for the lead frame of FIG. 5.

FIG. 10 shows typical dimensions of lead portions before and after bending the lead portions by using press-bending and non-press bending techniques. The press-bending of a lead portion having an original thickness of "t" by an angle of θ degrees provides a thickness of "tcosθ" at the bent portion, whereas maintains the original planar dimension "d" as viewed in the direction perpendicular to the original lead frame surface and along the bending direction. On the other hand, the non-press bending maintains the original thickness for the bent portion, whereas reduces the original planar dimension "d" down to "d-h(1/sinθ-tanθ)". These bending techniques can be arbitrarily selected in a feed line for feeding the lead frame to a packaging process without any special technique or equipment, and thus bending the lead portions with a high accuracy and at a relatively low cost.

The combination of both the bending techniques provides the advantage of the reduction of the gap between the lead portions. This advantageously provides an enough space for the collector lead and thus an excellent heat dissipation efficiency for the transistor element. In addition, the reduction of the distance between the semiconductor element 14 and base lead 22 or emitter lead 23 can be also obtained, which provides a smaller length of the bonding wire, thereby reducing the impedance thereof to further improve the transistor characteristics in the high frequency range.

Figure 11:
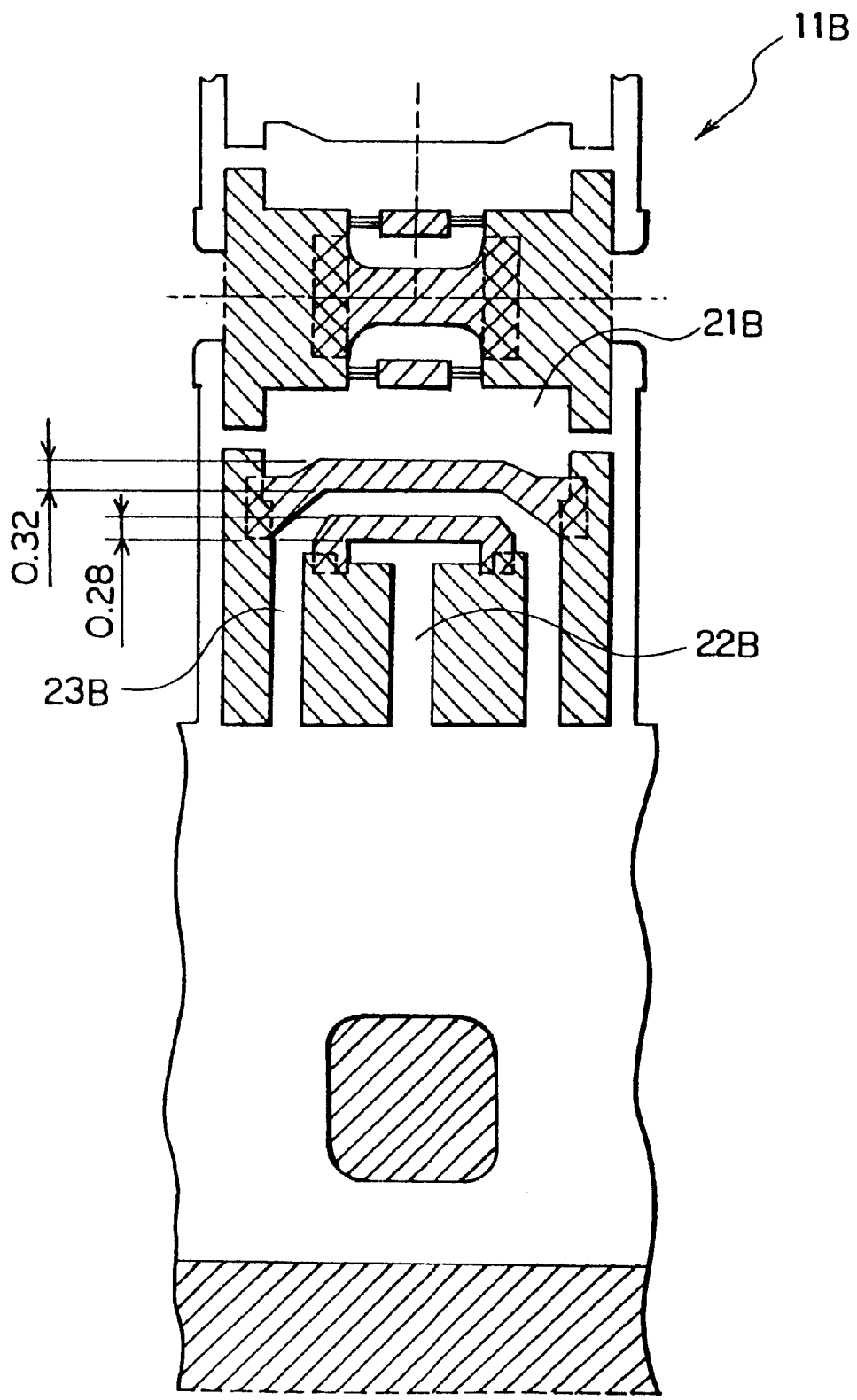
FIG. 11 is a top plan view of the lead frame of FIG. 5 at a step between the punching press and the bending process.

FIG. 11 shows the lead frame of FIG. 5 at a step before bending operation thereof, wherein hatching shows the portions which are removed by punching press to provide the gaps between lead portions. The gaps between the base lead 22B and emitter lead 23B and between the emitter lead 2BA and collector lead 21B are 0.28 mm and 0.32 mm, respectively, which are well larger than the lower limit 0.25 mm of the gaps corresponding to the thickness 0.25 mm of the lead frame 11A. The punching press of the lead frame plate to have a gap between lead portions which is larger than the thickness of the lead frame plate can be effected by a current punching press technique or etching technique without any problem.

Both the bending operations as described above do not require a large space therefor, wherein the dimensions of the lead frame can be reduced to save the material for the lead frame. In addition, since the transistor package of the present embodiment can be formed as having dimensions equal to the dimensions of the conventional SOT-89 package, a spare package for both the packages can be used in common.

Figure 12:
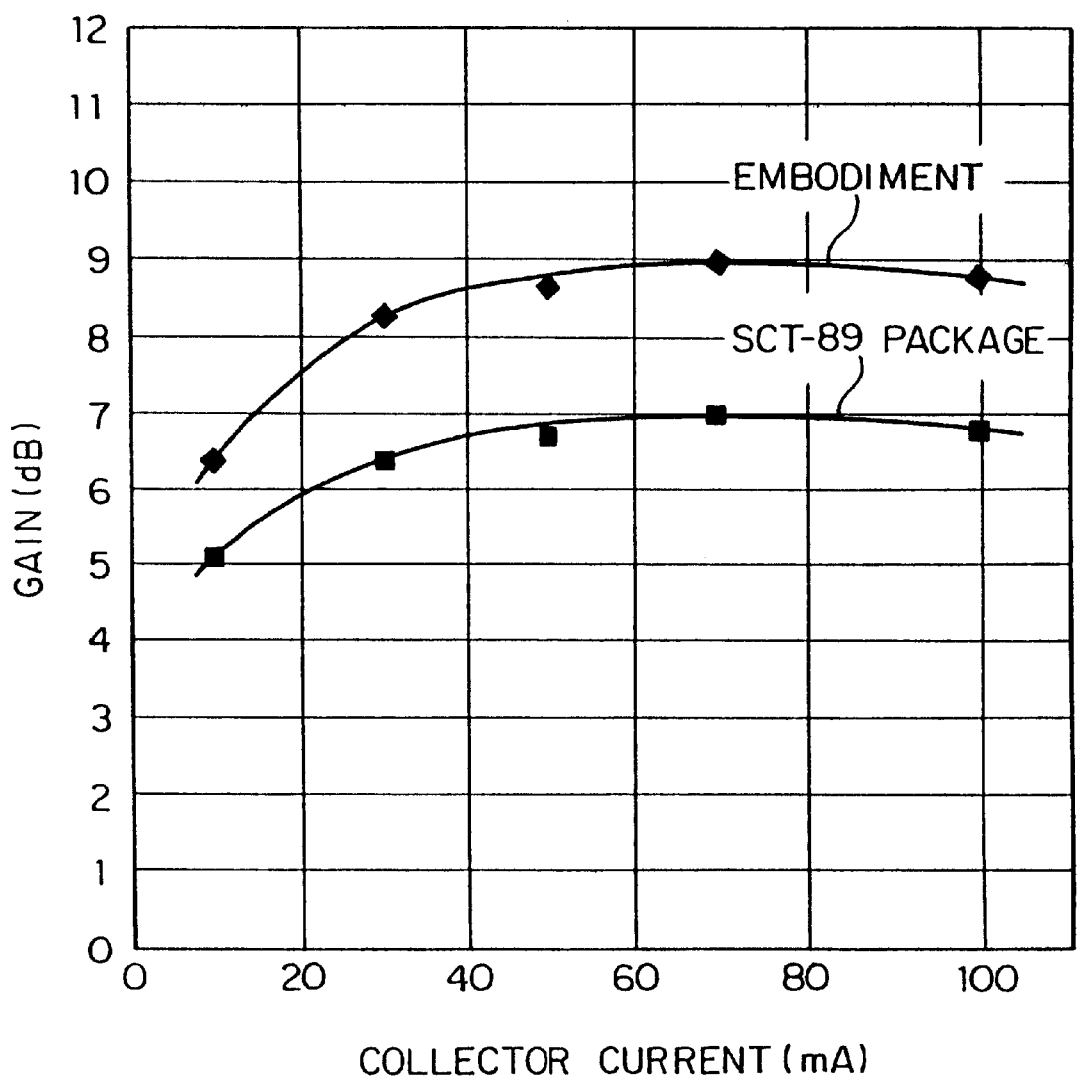
FIG. 12 graphically shows characteristics of the semiconductor packages of the present invention and conventional SOT-89 package in a high frequency range.

FIG. 12 shows results of comparison of the semiconductor package of the present embodiment and conventional SOT-89 package, wherein both the packages are compared against each other in the gain characteristics vs collector current at a frequency of 1 GHZ, which were measured in the circuit configuration of FIG. 1 for both the packages. The semiconductor package of the present embodiment showed an excellent gain about 2 dB higher than the gain of the conventional SOT-89 package to exhibit the advantage of the present invention.

Figure 13:
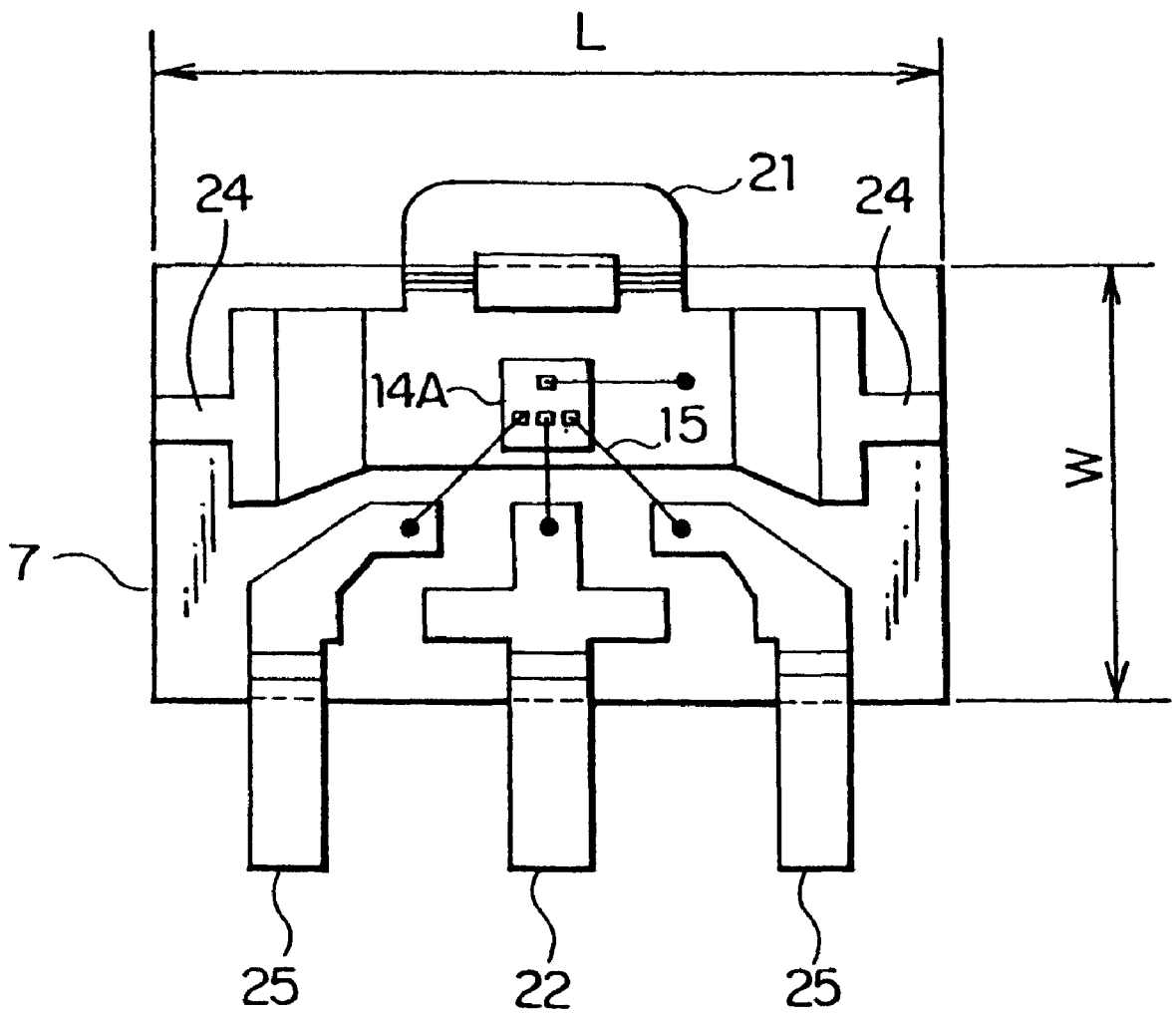
FIG. 13 is a top plan view of the internal arrangement of a semiconductor package according to a second embodiment of the present invention.

FIG. 13 shows a semiconductor package according to a second of the present invention. The semiconductor package of the present embodiment is similar to the first embodiment except for the configuration of the emitter lead in the present embodiment which is divided into two sections 25. Specifically, the configuration is such that the central portion of the emitter lead 23 extending parallel to the collector lead 21 between the base lead 22 and collector lead 21 in the first embodiment is removed to separate the two emitter lead sections 25 in the present embodiment. Each of the two emitter lead sections 25 is connected to a corresponding pad of the transistor element 14 with a bonding wire 15. By this configuration, the dimensions of the semiconductor package for the lead frame can be further reduced without reducing the space for the collector lead 21, or in other word, the space for the collector lead 21 can be further increased without increasing the dimensions of the semiconductor package.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a lead frame for use in a semiconductor package including the steps of forming from a metallic pattern plate said metallic pattern plate including a plurality of lead portions, each two of said lead portions defining there between a first gap, said first gap thickness is at least as thick as said metallic pattern plate, thereby reducing at least a gap between two of said lead portions down to a second gap lower than said thickness of said metallic pattern plate.

2. A method for manufacturing a lead frame for use in a semiconductor package as defined in claim 1 wherein said reducing step includes at least a press-bending technique.

3. A method for manufacturing a lead frame for use in a semiconductor package as defined in claim 1, wherein said reducing step includes at least a non-press bending technique.

4. A semiconductor package comprising a semiconductor element having a plurality of pads thereon, a plurality of leads connected to said pads with bonding wires, said plurality of leads including a first lead mounting thereon said semiconductor element, and a resin mold package substantially of a rectangular prism for molding said semiconductor element and said leads, wherein at least one of said leads is bent to provide a gap between two of said leads which is smaller than about 80% of a thickness of said leads.

5. A semiconductor package as defined in claim 4 wherein said rectangular prism has a rectangular surface substantially of about 4.5 mm×2.5 mm, said thickness of said leads is about 0.25 mm, and said gap is about 0.2 mm.

6. A semiconductor package as defined in claim 4 wherein said bending of at least one of said leads is effected by a press-bending technique.

7. A semiconductor package as defined in claim 4, wherein the gap is approximately 0.25 mm.

8. A semiconductor package as defined in claim 4, wherein the thickness of said leads is between 0.28 mm and 0.32 mm.

9. A semiconductor package as defined in claim 4, wherein said bending of at least one of said leads is effected by non-press bending technique.

10. A semiconductor package comprising a semiconductor element having a plurality of pads thereon, a plurality of leads connected to said pads with bonding wires, said plurality of leads including a first lead mounting thereon said semiconductor element, and a resin mold package substantially of a rectangular prism for molding said semiconductor element and said leads, wherein at least one of said leads is bent to provide a gap between two of said leads which is smaller than about 80% of a thickness of said leads, wherein said first lead occupies substantially a first half area of said resin mold package, and wherein said plurality of leads further include a pair of suspension leads for suspending said first lead at both sides of said first lead, a second lead occupying substantially a central part of a second half area of said resin mold package, and a third lead extending through a space between said first lead and second lead and both side parts of said second half area.

11. A semiconductor package comprising a semiconductor element having a plurality of pads thereon, a plurality of leads connected to said pads with bonding wires, said plurality of leads including a first lead mounting thereon said semiconductor element, and a resin mold package substantially of a rectangular prism for molding said semiconductor element and said leads, wherein at least one of said leads is bent to provide a gap between two of said leads which is smaller than about 80% of a thickness of said leads, wherein said first lead occupies substantially a first half area of said resin mold package, and wherein said plurality of leads further include a pair of suspension leads for suspending said first lead at both sides of said first lead, a second lead occupying substantially a central part of a second half area of said resin mold package, and a pair of third leads each occupying one of both side parts of said second half area.

* * * * *